United States Patent [19]

Koch et al.

[11] Patent Number: 5,049,478
[45] Date of Patent: Sep. 17, 1991

[54] CONTINUOUS PRODUCTION OF A PHOTOSENSITIVE RECORDING ELEMENT

[75] Inventors: Horst Koch, Gruenstadt; Karl-Rudolf Kurtz, Heidelberg; Thomas Telser, Weinheim; Manfred Zuerger, Sinsheim, all of Fed. Rep. of Germany

[73] Assignee: BASF Aktiengesellschaft, Ludwigshafen, Fed. Rep. of Germany

[21] Appl. No.: 412,995

[22] Filed: Sep. 26, 1989

[30] Foreign Application Priority Data

Oct. 4, 1988 [DE] Fed. Rep. of Germany ....... 3833650

[51] Int. Cl.$^5$ .......................... G03C 1/76; B29C 47/00
[52] U.S. Cl. ..................................... 430/270; 430/271; 430/273; 430/281; 430/285; 430/909; 430/910; 156/243; 156/244.27; 156/324
[58] Field of Search ............... 430/270, 271, 273, 281, 430/909, 910, 285; 156/324, 243, 244.27

[56] References Cited

U.S. PATENT DOCUMENTS

| 4,162,919 | 7/1979 | Richter et al. | 96/87 |
| 4,460,675 | 7/1984 | Gruetzmacher | 430/283 |
| 4,622,088 | 11/1986 | Min | 430/281 |
| 4,925,775 | 5/1990 | Hoffmann | 430/281 |

FOREIGN PATENT DOCUMENTS 0084851 8/1983 European Pat. Off. .
0185337 6/1986 European Pat. Off. .

*Primary Examiner*—Charles L. Bowers, Jr.
*Assistant Examiner*—John S. Y. Chu
*Attorney, Agent, or Firm*—Keil & Weinkauf

[57] ABSTRACT

A novel, improved continuous process for the production of a photosensitive recording element is described, whose photopolymerizable recording layer (A) consists of two or more individual strata ($a_n$) lying one on top of the other and firmly bonded to one another. The individual strata ($a_n$) may be of the same or roughly the same composition or of different compositions. In the novel, improved continuous process, the mixtures ($a_n$) used for the production of the individual strate ($a_n$) are prepared separately from one another and melted and, as separate molten material streams ($a_n$), are combined even before entering the nip of a calender, without the said streams mixing as a result of turbulence. During, before or directly after they have been combined, the molten material streams ($a_n$) are formed into molten sheet-like structures ($a_n$) lying one on top of the other, without the said streams mixing as a result of turbulence. Thereafter, the molten sheet-like structures ($a_n$) lying one on top of the other are introduced into the calender nip, one or both of the two outer molten sheet-like structures ($a_n$) in contact with the calender rollers forming a rotating melt bead or rotating bank. In the calender nip itself, the said sheet-like structures ($a_n$) are then calendered with production of the photopolymerizable recording layer (A) consisting of individual strata ($a_n$) lying one on top of the other and firmly bonded to one another.

17 Claims, No Drawings

CONTINUOUS PRODUCTION OF A PHOTOSENSITIVE RECORDING ELEMENT

The present invention relates to a novel, improved continuous process for the production of a photosensitive recording element having a photopolymerizable recording layer (A), in which the photopolymerizable recording layer (A) is built up from two or more individual strata ($a_n$) which lie one on top of the other and have the same or roughly the same composition or different compositions, by firmly bonding the said strata in the nip of a calender in one operation.

A photosensitive recording material whose photopolymerizable recording layer (A) consists of individual strata ($a_n$ which lie one on top of the other and have the same or roughly the same composition or different compositions is disclosed in DE-A-29 42 183. DE-A-29 42 183 also makes the general recommendation that the individual strata ($a_n$) can be laminated with one another to give a single photopolymerizable recording layer (A) by utilizing their natural tack or using solvents which effect partial dissolution. To obtain special properties, individual strata ($a_n$) of different formulations can be used, and the said strata can be extruded, calendered or pressed by a known method in one operation. DE-A-29 42 183, however, does not indicate the specific procedure for this.

Special extrusion and calendering processes for the production of photosensitive recording elements having a photopolymerizable recording layer (A) are disclosed in EP-B-0 084 851, EP-A-0 185 337 and EP-A-0 080 665.

For example, EP-A-0 080 665 discloses that a photopolymerizable mixture can be prepared by extrusion in a multiscrew devolatilizing extruder, extruded through a downstream slot die and introduced into the nip of a calender in such a way that a rotating melt bead or rotating bank is formed. This process makes it possible to form the photopolymerizable recording layer (A) with very precise and constant thickness. The photopolymerizable recording layer (A) can furthermore be bonded to a dimensionally stable base (B) and a cover sheet (D) which is readily detachable from the surface of the photopolymerizable recording layer (A), this procedure being carried out in the calender nip itself to give a photosensitive recording element having the structure (B+A+D). However, this process is used merely for the production of photosensitive recording material whose photopolymerizable recording layer (A) does not consist of individual strata ($a_n$) firmly bonded to one another.

In the process according to EP-B-0 084 851, a photopolymerizable mixture is calendered, in the nip of a calender, between a dimensionally stable base (B) and a multilayer top element consisting of an elastomeric layer, if necessary a soluble, flexible top layer (C) and a cover sheet (D) which can readily be peeled off from the elastomeric layer or from the soluble, flexible top layer (C), in such a way that the photopolymerizable mixture forms a photopolymerizable recording layer (A) between the base (B) and the multilayer top element. However, it is also possible for the multilayer top element to be applied by lamination or pressing after the calendering procedure.

EP-A-0 185 337 relates to an embodiment of the process disclosed in EP-A-0 084 851, the embodiment relating exclusively to the production of the multilayer top element from the elastomeric layer,, if necessary the soluble, flexible top layer (C) and the cover sheet (D). The embodiment comprises, in the production of the multilayer top element, forming at least the elastomeric layer by
(i) extrusion and
(ii) stretching and then
(iii) covering it on one side with the cover sheet (D).

Thereafter, that side of the elastomeric layer which is then free can be joined to a detachable sheet which serves for temporary protection of the elastomeric layer.

In an additional process variant, the multilayer top element is produced from the elastomeric layer, the soluble, flexible top layer (C) and the cover sheet (D) which is readily detachable therefrom, by
(i) separate extrusion of the mixtures used for the production of the elastomeric layer and of the top layer (C) in two extruders,
(ii) combination of these two extruded mixtures, without mixing, by means of an adapter common to both extruders,
(iii) extrusion of the combined molten mixtures through a slot die downstream of the adapter, in the form of a double layer, and
(iv) joining of the double layer consisting of the elastomeric layer and the top layer (C) to the cover sheet (D) which is readily detachable from the surface of the top layer (C), in a calender.

The known processes for the production of a photosensitive recording element having a photopolymerizable recording layer (A) which consists of individual strata ($a_n$) lying one on top of the other and firmly bonded to one another have disadvantages.

For example, in the conventional processes, the photopolymerizable recording layer (A) cannot be produced in a simple operation from individual strata ($a_n$) but the said strata have to be produced in various ways, at different times and/or in different plants. This gives rise to problems with regard to matching of the parameters relating to composition and apparatuses and with respect to the sequence of the individual process steps. This often gives rise to difficulties with respect to the reproducibility of the process conditions, resulting directly in a varying property profile of the products. For example, fluctuations in the thickness of the individual strata ($a_n$) of the photopolymerizable recording layer (A) are frequently encountered and/or the individual strata ($a_n$) do not adhere firmly to one another, so that the relevant photopolymerizable recording layer (A) is not very suitable or is unsuitable for further processing. The disadvantages of the conventional processes are of course also noticeable in the products produced by the said processes, i.e. the photosensitive recording elements. If these photosensitive recording elements produced in a conventional manner are exposed imagewise to actinic light and then developed, the resulting relief printing plates have performance characteristics which do not meet the increasing requirements in practice. Thus, these relief printing plates do not reproduce the motif of the photographic negative sufficiently faithfully to the original detail, which presents problems in particular in very fine and therefore critical image elements. Furthermore, the life of these relief printing plates under printing conditions does not come up to expectations, so that their reusability is also adversely affected.

It is an object of the present invention to provide a novel, improved continuous process for the production of photosensitive recording elements having a photopolymerizable recording layer (A), which process no longer has the disadvantages of the prior art and gives photosensitive recording elements which, after imagewise exposure to actinic light and after development, are very suitable for relief printing.

We have found that this object is achieved by a continuous process for the production of a photosensitive recording element having a photopolymerizable recording layer (A), in which the photopolymerizable recording layer (A) is produced from two or more individual strata $(a_n)$ which lie one on top of the other and have the same or roughly the same composition or different compositions, by firmly bonding the said strata in the nip of a calender in one operation, the said continuous process comprising the steps of (1) separately melting the mixtures $(a_n)$ used for the production of the individual strata $(a_n)$ and combining the resulting, separate material streams $(a_n)$ in the molten state even before they enter the calender nip, without mixing them through turbulence, (2) shaping the molten material streams $(a_n)$ to give molten sheet-like structures $(a_n)$ lying one on top of the other, before they enter the calender nip, before, during or directly after the said streams have been combined, without mixing them through turbulence, (3) introducing the molten sheet-like structures $(a_n)$ lying one on top of the other into the calender nip, one or both of the two outer molten sheet-like structures $(a_n)$ in contact with the calender rollers forming a rotating melt bead or rotating bank, and (4) calendering the molten sheet-like structures $(a_n)$ lying one on top of the other with production of the photopolymerizable recording layer (A) consisting of individual strata $(a_n)$ which lie one on top of the other and are firmly bonded to one another.

For the sake of brevity, the novel continuous process for the production of a photosensitive recording material having a photopolymerizable recording layer (A) which consists of individual strata $(a_n)$ lying one on top of the other and firmly bonded to one another will be referred to below as the novel process.

In the present invention, the index n relates to the order in which the individual strata (a) lie one on top of the other in the photopolymerizable recording layer (A), the index of the uppermost individual stratum also corresponding to the number of individual strata $(a_n)$ present. It is accordingly an integer which may be from 1 to n.

The novel process starts from the preparation of the mixtures $(a_n)$ which are used for the production of the individual strata $(a_n)$. The number of mixtures $(a_n)$ used in the novel process depends on the number of individual strata $(a_n)$ which finally form the photopolymerizable recording layer (A) of the photosensitive recording elements. The novel process is carried out using two or more mixtures $(a_1)$ and $(a_2)$. However, it is also possible to use more than two mixtures $(a_{1,2,3\ to\ n})$, it being advantageous for the novel process and for the products to use two, three, four, five or six mixtures $(a_n)$. In very special cases, it is also possible to use more than six mixtures $(a_n)$, for example seven, eight or nine. However, the advantage which results with regard to the products, i.e. the photosensitive recording elements, is generally offset by the higher cost for apparatus. The novel process is most advantageously carried out using two to four mixtures $(a_n)$, the use of two or three mixtures $(a_n)$ being optimum both from the point of view of process engineering and from the point of view of product quality.

The ratio of the amounts of the mixtures $(a_n)$ depends exclusively on the required thickness of the individual strata $(a_n)$ produced from the mixtures $(a_n)$ in the photopolymerizable recording layer (A).

The mixtures $(a_n)$ used in each case for carrying out the novel process may have the same composition, i.e. they are identical both in terms of their components and in terms of the ratio of the amounts of these components.

The mixtures $(a_n)$ used in each case for the novel process can, however, also have roughly the same composition. This means that the individual mixtures $(a_n)$ differ only slightly from one another. The difference may be in the ratio of the amounts of the components or may relate to the use of different but comparatively small amounts of components available.

The mixtures $(a_n)$ used for carrying out the novel process can, however, also have different compositions. This means that they differ substantially from one another in their contents of essential components.

In the novel process, it is of course also possible to use mixtures $(a_n)$ where, for example, two are of identical composition whereas the remaining mixtures $(a_n)$ differ slightly and/or substantially from these two mixtures $(a_n)$.

The mixtures $(a_n)$ are themselves photopolymerizable or they become photopolymerizable in the course of the novel process, as a result of contact with one or more molten material streams $(a_n)$ produced from such a photopolymerizable mixture $(a_n)$, one or more molten sheet-like structures $(a_n)$ or one or more molten individual strata $(a_n)$. In the novel process, it is essential to use one or more photopolymerizable mixtures $(a_n)$ which finally impart photopolymerizability to one or more further molten individual strata $(a_n)$. However, two, three or more of the mixtures $(a_n)$ may independently be photopolymerizable. The decision as to whether the novel process is to be carried out using only one photopolymerizable mixture $(a_n)$, with two or more photopolymerizable mixtures $(a_n)$ or exclusively with photopolymerizable mixtures $(a_n)$ depends exclusively on the property profile desired for the photopolymerizable recording layer (A) of the photosensitive recording element.

According to the invention, the mixtures $(a_n)$ are prepared separately from one another, after which they are present in the molten state. In terms of process engineering, the preparation of the mixtures $(a_n)$ has no special features but is carried out by the conventional methods for the preparation of mixtures which mainly contain polymers, in particular elastomers. Accordingly, the conventional kneading, dissolution or extrusion methods are suitable here, as usually carried out with the aid of kneaders, stirred kettles or single-screw and multiscrew devolatilizing extruders. Advantageously, the mixtures $(a_n)$ are prepared from their components in extruders, the use of multiscrew devolatilizing extruders being very particularly advantageous. The conditions under which extrusion is effected depend on the desired composition of the mixtures $(a_n)$, on their viscosity resulting from the particular composition, on the thermal stress to which the components used can be subjected and on whether these components are liquid or solid. In many cases, the multiscrew devolatilizing extruders described in EP-B-0 080 660 and the extrusion conditions described there have proven useful.

The components used for the preparation of suitable mixtures ($a_n$) are substances as usually used for the production of photopolymerizable recording layers (A).

Suitable mixtures ($a_n$) essentially consist of
(i) one or more polymers as binders, where the polymers may also contain photopolymerizable olefinically unsaturated side or terminal radicals,
(ii) one or more photopolymerization initiators,
(iii) one or more photopolymerizable olefinically unsaturated saturated compounds (monomers) which are compatible with the binder and, if necessary,
(iv) one or more assistants with the aid of which the performance characteristics are varied.

The term compatible indicates that the relevant component can be distributed in the particular mixture ($a_n$) to give a molecular disperse state, does not produce any turbidity in the said mixture and does not separate out in the course of time.

Variation of the property profile is the selective improvement of certain performance characteristics of photopolymerizable recording layers (A) and of photopolymerized relief layers (A') produced therefrom. These improvements are evident in particular in photoresists and relief printing plates containing photopolymerized relief layers (A') and are generally achieved by adding conventional additives to the photopolymerizable recording layers (A). These additives are therefore often also referred to as assistants.

For the preparation of the mixtures ($a_n$), the polymeric binders are usually used in an amount of from 20 to 99, preferably from 30 to 90, in particular from 40 to 85, % by weight, based on the total amount of the particular mixture ($a_n$) to be prepared.

Polymeric binders which are suitable for this purpose are those of the polymer classes consisting of the polyamides, copolyamides, polyesters, polyurethanes, polyalkadienes, vinylaromatic/alkadiene copolymers and block copolymers, alkadiene/acrylonitrile copolymers, butyl rubbers, acrylate rubbers, polychloroprenes, fluorine rubbers, polysulfide rubbers, silicone rubbers, ethylene/propylene copolymers, the chlorosulfonated polyethylenes, the ethylene/(meth)acrylate, ethylenevinyl acetate and ethylene/(meth)acrylic acid copolymers, alkadiene/(meth)acrylic acid copolymers and the (meth)acrylic acid/(meth)acrylate copolymers. These polymers which are suitable binders are known compounds and are obtained by conventional methods of polymer chemistry.

Particularly suitable binders are those of the polymer classes consisting of the polyamides, copolyamides, polyalkadienes, vinylaromatic/alkadiene copolymers and block copolymers, alkadiene/acrylonitrile copolymers, ethylene/propylene copolymers, ethylene/(meth)acrylic acid copolymers and the alkadiene/(meth)acrylic acid copolymers.

Examples of particularly suitable polymeric binders from the class consisting of the polyamides or copolyamides are linear homo- and copolyamides, which are prepared in a conventional manner from bifunctional carboxylic acids and diamines or from $\omega$-amino acids, lactams or suitable derivatives of these compounds.

Examples of particularly suitable binders from the polymer class consisting of the alkadienes are natural rubber, the homopolymers of butadiene or isoprene and butadiene/isoprene copolymers.

Examples of particularly suitable binders from the polymer class consisting of the vinylaromatic/alkadiene copolymers are copolymers of styrene and butadiene and/or isoprene having a random distribution of the copolymerized monomers and preferably containing from 10 to 50% by weight, based on the copolymer, of copolymerized styrene.

Examples of particularly suitable binders from the polymer class consisting of the vinylaromatic/alkadiene block copolymers are those which contain one or more elastomeric diene polymer blocks X and one or more thermoplastic vinylaromatic polymer blocks Y.

Examples of advantageous alkadienes are butadiene, isoprene, pentane-1,3-diene, 2,3-dimethylbutadiene and hexane-2,4-diene, butadiene and/or isoprene being preferred.

Examples of advantageous vinylaromatics are styrene, $\alpha$-methylstyrene, p-methylstyrene, p-tert-butylstyrene and 1-vinylnaphthalene, styrene being preferred.

Examples of particularly suitable block copolymers are the thermoplastic elastomeric three-block copolymers Y-X-X', in which Y is a thermoplastic, nonpolymers resilient styrene polymer block, X is an elastomeric butadiene and/or isoprene polymer block and Y' is an elastomeric polymer block which differs from X and consists of copolymerized butadiene and/or isoprene and, if required, copolymerized styrene.

Further examples of particularly suitable block copolymers are four-block copolymers, such as X-Y-X-Y, Y-X-X'-Y, Y-X-Y-X' or X-X'-Y-X.

Examples of particularly suitable binders from the polymer class consisting of the alkadiene/acrylonitrile copolymers are the nitrile rubbers, such as butadiene/acrylonitrile copolymers having an acrylonitrile content of from 15 to 40% by weight.

Examples of particularly suitable binders from the polymer class consisting of the ethylene/(meth)acrylic acid copolymers are those which are obtainable by copolymerization of monomeric mixtures which consist of ethylene, acrylic acid and/or methacrylic acid and one or more further monomers from the group consisting of the vinyl esters, the vinyl ethers, acrylates, methacrylates, acrylamides and methacrylamides.

Examples of very particularly preferred copolymers of the stated type are ethylene/(meth)acrylic acid copolymers which contain n-butyl acrylate, 2-ethylhexyl acrylate and/or $\omega$-methylpoly(ethylene oxide)-$\alpha$-yl acrylate as polymerized comonomers.

Examples of particularly suitable binders from the class consisting of the ethylene/propylene copolymers are ethylene/propylene/alkadiene terpolymers having an ethylene content of from 40 to 80% by weight and a double bond content of from 2 to 20 olefinic double bonds per 1,000 carbon atoms, terpolymers which contain dicyclopentadiene, ethylidenenorbornene and trans-hexa-1,4-diene as copolymerized alkadienes being very particularly suitable.

Examples of particularly suitable binders from the class consisting of the alkadiene/(meth)acrylic acid copolymers are butadiene/methacrylic acid, butadieneacrylic acid and butadiene/(meth)acrylic acid/(meth)acrylate copolymers.

Where these polymeric binders contain photopolymerizable olefinically unsaturated radicals, their amount is from 1 to 60, preferably from 1.5 to 40, advantageously from 2 to 30, in particular from 2 to 15, % by weight, based on the total amount of the relevant mixture ($a_n$) to be prepared.

For the preparation of the mixtures ($a_n$), the photopolymerization initiators are usually used in an amount of from 0.001 to 10, preferably from 0.1 to 7, advantageously from 0.2 to 5, in particular from 0.3 to 4, % by weight, based on the total amount of the relevant mixture ($a_n$) to be prepared. The conventional, commercial photopolymerization initiators are particularly suitable here.

For the preparation of the mixtures ($a_n$), the monomers are usually used in an amount of from 1 to 60, preferably from 1.5 to 40, advantageously from 2 to 30, in particular from 2 to 15, % by weight, based on the relevant mixture ($a_n$) to be prepared. Monomers which are suitable for this purpose generally have a boiling point above 100° C. under atmospheric pressure and a molecular weight of not more than 3,000, in particular not more than 2,000. Examples of suitable monomers are the esters of acrylic acid and/or methacrylic acid with monohydric or polyhydric alcohols, the vinyl esters of aliphatic monocarboxylic acids, the diesters of fumaric and maleic acid or the reaction products of OH-terminated, oligomeric polybutadienes with maleic acid or (meth)acrylic acid, i.e. oligomeric polybutadienes having photopolymerizable olefinic double bonds. Monomers of the stated type are conventional and known and are commercially available.

For the preparation of the mixtures ($a_n$), it is also possible to use assistants with the aid of which the performance characteristics are varied. These assistants are, in particular, conventional and known, commercially available plasticizers, thermal polymerization inhibitors, dyes, pigments, photochromic additives, agents for improving the relief structure, crosslinking agents, antioxidants, antiozonants, fillers, fluxes or mold release agents. In general, they are used in an amount of not more than 40% by weight, based on the relevant mixture ($a_n$) to be prepared.

After their preparation, the mixtures ($a_n$) are present in the molten state and contain the selected components in the particular amounts required. If, however, two mixtures ($a_1$) and ($a_2$) contain identical polymeric binders, photopolymerization initiators and monomers in identical amounts, they are themselves photopolymerizable and have the same composition. If, however, the mixture ($a_2$) contains the components of mixture ($a_1$) but in different amounts, both mixtures ($a_1$) and ($a_2$) are themselves photopolymerizable but have only roughly the same composition.

If, on the other hand, the mixture ($a_2$) contains components which are in principle suitable for the preparation of mixture ($a_1$) but are not present therein, both mixtures ($a_1$) and ($a_2$) are themselves photopolymerizable but have different compositions. The difference in the compositions may be due to the use of different binders, photopolymerization initiators, monomers and/or assistants. If, for example, the mixture ($a_2$), in contrast to the mixture ($a_1$) does not contain any photopolymerization initiators, it is itself nonphotopolymerizable and will only become photopolymerizable in the course of the process through contact with the photopolymerizable molten material stream ($a_1$) produced from the photopolymerizable mixture ($a_1$), with the photopolymerizable molten sheet-like structure ($a_1$) and/or with the photopolymerizable individual stratum ($a_{1'}$).

Regardless of which mixtures ($a_n$) are used for the production of the photopolymerizable recording layer (A), it is very particularly advantageous, according to the invention, if the individual mixtures ($a_n$) each contain different dyes, pigments or photochromic additives. Accordingly, it is very particularly advantageous in the novel process if mixtures ($a_n$) of roughly the same composition or of different compositions are used.

In the further course of the novel process, the molten mixtures ($a_n$) are combined as separate material streams ($a_n$) in the molten state even before they enter the calender nip, without the said mixtures mixing through turbulence.

Turbulence is understood here as meaning the turbulence at phase boundaries which is caused by mechanical influences, as known to occur at the phase boundary between two flowing liquids, where of course mass transfer takes place.

The molten material streams ($a_n$) are combined by means of an adapter (coextrusion feedblock), which is common to the delivery pumps transporting the material streams ($a_n$), single-screw extruders and/or multiscrew devolatilizing extruders. These adapters are conventionally used in the industrial area of coextrusion and are employed for combining different product streams without mixing. The use of these adapters for combining photopolymerizable material streams ($a_n$) without mixing is not evident from the prior art.

Instead of an adapter, a multilayer die is also used for combining the molten material streams ($a_n$).

In a procedure which is preferred according to the invention, the mixtures ($a_n$) are prepared separately from one another in different multiscrew devolatilizing extruders and are transported therein, as separate material streams ($a_n$), to an adapter common to the multiscrew devolatilizing extruders and to a multilayer die common to the multiscrew extruders.

If an adapter is used for the novel process, a slot die is located downstream of the said adapter. In this slot die, the unmixed molten material streams ($a_n$) are shaped into molten sheet-like structures ($a_n$) even before they enter the calender nip, without the said material streams mixing through turbulence, and are then discharged as molten sheet-like structures ($a_n$) lying one on top of the other. In many cases, the use of the slot die as described in EP-B-0 080 665 has proven useful, although these were not intended for the purpose according to the invention.

If a multilayer die is used for combining the molten material streams ($a_n$) in the novel process, the said material streams are formed in the multilayer die during or directly before they are combined to give molten sheet-like structures ($a_n$) lying one on top of the other, so that there is no need to use an adapter.

In the further course of the novel process, the molten sheet-like structures ($a_n$) lying one on top of the other are introduced into the nip of a calender. Here, one or both of the two outer molten sheet-like structures ($a_n$) in contact with the calender rollers form a rotating melt bead or rotating bank. In many cases, surprisingly, the methods described in EP-B-0 080 665 for introducing a single molten sheet-like structure ($a_1$) into a calender nip have proven useful for this purpose, although these methods were not intended for the purpose according to the invention.

It is very particularly advantageous for the novel process if the time between the combination of the molten material streams ($a_n$) and the entry of the molten sheet-like structures ($a_n$) lying one on top of the other into the calender nip is from 10 seconds to 5 minutes, in particular 30 seconds to 3 minutes.

It is also very particularly advantageous for the novel process if the molten sheet-like structure ($a_n$) which forms the rotating melt bead or rotating bank has a melt flow index /MFI) which is 1.1, advantageously 1.2, in particular 1.3, times higher than that of the molten sheet-like structure ($a_n$) directly adjacent.

Excellent results are obtained if both abovementioned conditions are maintained in the novel process.

According to the invention, the molten sheet-like structures ($a_n$) lying one on top of the other are calendered after they have entered the calender nip, with production of the photopolymerizable recording layer (A) consisting of individual strata ($a_n$) which lie one on top of the other and are firmly bonded to one another. As a result of calendering, the individual strata ($a_n$) are firmly bonded to one another, and their thickness is adjusted to the desired values with high precision and constancy.

After the calendering procedure, some or all of the individual strata ($a_n$) of the photopolymerizable recording layer (A) produced in the novel manner may still be in the molten state. If this is the case, calendering may be followed by a cooling step.

In many cases, surprisingly, the calenders and calendering conditions stated in EP-A-0 080 665 have proven useful for calendering in the manner according to the invention, although they were not intended for the purpose according to the invention.

The total thickness of the photopolymerizable recording layer (A) produced in the novel procedure depends primarily on the intended use of the photosensitive recording elements which contain such a photopolymerizable recording layer (A) or consist of the said layer. Thus, the total thickness generally varies from 0.001 to 7, preferably from 0.1 to 7, in particular from 0.7 to 6.5, mm, because the photosensitive recording elements having such a photopolymerizable recording layer (A) form, after imagewise exposure to actinic light and developed with a developer, photopolymerized relief layers (A') which are suitable for the majority of printing methods, in particular for flexographic printing, and for the photoresist technique.

The photopolymerizable recording layer (A) produced by the novel procedure can be bonded in a conventional manner, by subsequent lamination, backing, calendering or hot-pressing, with a dimensionally stable base (B) which may or may not have an adhesion-promoting layer, with a temporary base (B) which can readily be peeled off again from the surface of the photopolymerizable recording layer (A), with a soluble, flexible, top layer (C) and/or with a cover sheet (D) which is readily detachable from the surface of the photopolymerizable recording layer (A) or from the surface of the soluble, flexible top layer (C).

Examples of suitable dimensionally stable or temporary bases (B) are sheets, films or conical or cylindrical sleeves of metals, plastics or composite materials. If highly reflective sheets or films are used as the base (B), they may contain conventional antiinhalation agents. However, the antiinhalation agents may also be present as a separate layer on the bases (B) or may be contained in the adhesion-promoting layer. Examples of suitable top layers (C) are disclosed in, for example, U.S. Pat. No. 4 162 919. Suitable cover sheets (D) are usually from 10 to 250 µm, in particular from 20 to 150 µm, thick and essentially consist of plastics, textile materials, paper or metals. The surface of these cover sheets (D) which lies directly on the top layer (C) or on the photopolymerizable recording layer (A) may be smooth or mat. If the surface is mat, its roughness pattern becomes impressed in the layers underneath. Moreover, the smooth or mat surface of the cover sheet (D) may be treated to render it antiadhesive, i.e. it may contain, for example, a 0.1–0.5 µm thick antiadhesion layer of conventional materials.

It is moreover very particularly advantageous if the photopolymerizable recording layer (A) to be prepared by the novel procedure is bonded to the abovementioned bases (B), top layers (C) and/or cover sheets (D) even during the novel process itself, in one operation. For this purpose, the molten sheet-like structures ($a_n$) which are discharged from the slot die or from the multilayer die and lie one on top of the other are introduced together with the abovementioned layer-like materials into the calender nip, where they are bonded in a suitable manner to the photopolymerizable recording layer (A) in one operation. Thus, the free side of an outer individual stratum ($a_n$) can advantageously be bonded to a temporary base (B) which can readily be peeled off from this individual stratum ($a_n$), or, if required, can be bonded via an adhesion-promoting layer to a dimensionally stable base (B). At the same time, the free side of the other outer individual stratum ($a_n$) can be bonded to a cover sheet (D), if necessary via a top layer (C). As a result, a photosensitive recording element which contains the photopolymerizable recording layer (A) produced in the novel manner is obtained in a surprisingly simple way.

The novel process has particular advantages. For example, photopolymerizable recording layers (A) which consist of individual strata ($a_n$) lying one on top of the other and firmly bonded to one another can be produced with very accurate and constant thickness by the novel process in one operation at one and the same time. It is possible to obtain photopolymerizable recording layers (A) whose individual strata ($a_n$) have very different compositions but which nevertheless adhere very particularly firmly to one another. This particular advantage of the novel process cannot be rated highly enough because in fact inadequate or poor adhesion of the individual strata ($a_n$) to one another makes the photopolymerizable recording layer (A) virtually useless in practice. Thus, however, the individual strata ($a_n$) adhere firmly to one another and the photopolymerizable recording layers (A) consisting of the said strata and produced in the novel manner can be used for a very wide range of applications. The particular advantages of the novel process thus become especially clear in the photosensitive recording elements which contain or consist of the photopolymerizable recording layer (A) produced in the novel manner. These photosensitive recording elements are of very accurate and constant thickness, which is very important not only for the user but also for the manufacturer. The photosensitive recording elements can therefore particularly advantageously be used for the production of relief printing plates and photoresists, and they are very suitable in particular for the production of flexographic printing plates. The relief printing plates and photoresists are produced from the photosensitive recording elements in a conventional manner by imagewise exposure of the photopolymerizable recording layer (A) to actinic light having a wavelength λ of from 230 to 450 nm, in particular from 350 to 450 nm, and development of the unexposed areas of the image-wise exposed photopolymerizable recording layer (A) by means of suitable developers.

In general, the thickness of the photopolymerized relief layer (A') obtained in this manner varies from 0.001 to 7 mm, preferably from 0.1 to 7 mm, in particular from 0.7 to 6.5 mm, depending on the intended use. The relief printing plates thus obtained, in particular the flexographic printing plates, can be mounted on printing cylinders and used for printing continuous stationery, whereas the relevant photoresists can be used, for example, for the production of printed circuit boards.

In addition, with the aid of the novel process, the property profile of the relief printing plates, in particular of the flexographic printing plates, can be adjusted by varying the compositions of the individual strata $(a_n)$ of the photopolymerizable recording layer (A) in a selected but simple manner, and can be advantageously adapted to the particular practical requirements. This has made possible to produce, in a simple manner, relief printing plates, in particular flexographic printing plates, which have a polishable surface, which is particularly advantageous in the production of seamless continuous printing plates, whose surface is non-tacky and therefore need not be aftertreated, which are ozone-resistant, considerably prolonging their life under printing conditions and ensuring that they can be reused, which are resistant to printing ink solvents based on ketone/ethyl acetate, making them more versatile, whose relief has particularly high optical contrast, considerably facilitating quality control, in which photopolymerized relief layers (A') developed with aqueous developers or with water are combined with lower layers developed with nonaqueous systems, making the originally used developing methods simpler and more reliable as well as increasing the swelling resistance of the photopolymerized relief layers (A') to a large number of printing ink solvents and/or in which comparatively hard photopolymerized relief layers (A') are combined with soft lower layers, substantially improving the printing characteristics To date, it has not been possible to achieve this wide range of advantageous properties by means of a single process, and instead a plurality of different processes always had to be used in order to obtain some or all of these advantages simultaneously.

The Examples which follow illustrate the process according to the invention.

EXAMPLE 1

Production of a photosensitive recording element by the novel process and the use of this photosensitive recording element for the production of a flexographic printing plate.

The photopolymerizable mixture $(a_1)$ used for the production of the photopolymerizable recording layer (A) consisted of 81.8% by weight of a three-block rubber having the structure styrene/isoprene/styrene (Cariflex ® from Shell AG), 1.2% by weight of benzil dimethyl acetal, 2.0% by weight of 2,6-di-tert-butyl-p-cresol, 5.0% by weight of 1,6-hexanediol diacrylate and 10.0% by weight of liquid paraffin (white oil S 5000. The photopolymerizable mixture $(a_1)$ was prepared in a conventional manner in a twin-screw devolatilizing extruder and was transported therein, as a molten material stream $(a_1)$, to a two-layer die. The maximum temperature of the molten material stream $(a_1)$ was 155° C., the throughput was 30 kg/hour and the residence time in the extruder was 5 minutes. Before entering the two-layer die from below, molten material stream $(a_1)$ passed through a 40 μm metal fabric filter.

The photopolymerizable mixture $(a_2)$ used for the production of the photopolymerizable recording layer (A) consisted of 71.497% by weight of a terpolymer of 58 parts by weight of ethylene, 21 parts by weight of acrylic acid and 21 parts by weight of 2-ethylhexyl acrylate, 6% by weight of glycidyl methacrylate, 15% by weight of N-n-butylbenzenesulfonamide (Cetamo ® BMB from BASF AG), 5% by weight of butylethanolamine, 1.2% by weight of benzil dimethyl acetal, 0.8% by weight of the potassium salt of N-nitroso-N-cyclohexylhydroxylamine combined with 0.003% by weight of Safranin T (C.I.50,240) and 0.5% by weight of 2,6-di-tert-butyl-p-cresol. It was prepared separately from the photopolymerizable mixture $(a_1)$, in a twin-screw devolatilizing extruder, and was transported as a molten material stream $(a_2)$ to the two-layer die. The maximum temperature of the molten material stream $(a_2)$ was 140° C., the throughput was 10 kg/hour and the residence time in the extruder was 7 minutes. Before entering the two-layer die from above, the molten material stream $(a_n)$ passed through a 40 μm metal fabric filter.

The melt flow indices of material streams $(a_1)$ and $(a_2)$ were determined separately in a conventional manner under a weight of 0.6 kg according to DIN 53,735. Material stream $(a_1)$, having a melt flow index of 2 g/10 minutes at 150° C., proved to be more highly viscous than material stream $(a_2)$, having a melt flow index of 100 g/10 minutes at 150° C. Accordingly, material stream $(a_2)$ had a melt flow index 50 times higher than that of material stream $(a_1)$.

The two molten material streams $(a_1)$ and $(a_2)$ were combined in the two-layer die, the molten material stream $(a_1)$ being fed in from below and the molten material stream $(a_2)$ from above. The two material streams $(a_1)$ and $(a_2)$ were extruded as molten sheet-like structures $(a_1)$ and $(a_2)$ lying one on top of the other and 33.5 cm wide, at a die temperature of 145° C., and were then immediately fed to the nip of a calender, the molten sheet-like structure $(a_2)$ having the lower viscosity forming the melt bead or rotating bank. The residence time between combination of the said sheet-like structures $(a_1)$ and $(a_2)$ and entry into the calender nip was 30 seconds. The temperature of the calender rollers was 80° C.

Together with the molten sheet-like structures $(a_1)$ and $(a_2)$ lying one on top of the other, a base film (dimensionally stable base B) coated with an adhesion-promoting layer was introduced into the calender nip on the side of the sheet-like structure $(a_1)$ and a cover sheet (D) coated with a top layer (C) was introduced on the side of the sheet-like structure $(a_2)$. 125 μm thick biaxially oriented polyethylene terephthalate films were used as cover sheet and base film. In their function as cover sheet (D), they were coated on one side with a 5 μm thick layer of a polyvinyl alcohol/ethylene oxide block copolymer (Mowiol ® 04/M1 from Hoechst AG) (top layer C). In their function as base film (B), they were provided on one side with a 5 μm thick adhesion-promoting polyurethane layer.

During calendering in the calender nip, the molten sheet-like structures $(a_1)$ and $(a_2)$ lying one on top of the other were formed into a 2100 μm thick individual stratum ($a_1$) and into a 700 μm thick individual stratum ($a_2$), the two individual strata ($a_1$) and ($a_2$) also being firmly bonded to one another to form the photopolymerizable recording layer (A). The overall result was a photosensitive recording element in which the 125 μm thick base film, the 5 μm thick adhesion-promoting layer, the 2100 μm thick individual stratum ($a_1$), the 700 μm thick individual stratum ($a_2$), the top layer (C) and the cover sheet (D) lay one on top of the other in the stated order, the two individual strata ($a_1$) and ($a_2$) together forming the photopolymerizable recording layer (A).

Samples of this photosensitive recording element, produced in the novel manner, were taken and were used to show that even the nonpolymerized individual strata ($a_1$) and ($a_2$) were firmly bonded to one another and were delimited from one another by a well defined phase boundary. This means that the two individual strata ($a_1$) and ($a_2$) were of constant thickness over the entire width and length of the photopolymerizable recording layer (A), further underlining the advantageous nature of the novel process.

The photosensitive recording element produced by the novel process was further processed to give a flexographic printing plate.

For this purpose, the cover sheet (D) was first peeled off from the photosensitive recording element. Thereafter, a photographic negative was placed on the top layer (C) after which the photopolymerizable recording layer (A) was exposed imagewise through the photographic negative for 15 minutes under reduced pressure in a 100 watt tubular exposure unit. The imagewise exposed recording layer (A) was then developed with a developer (1% of sodium carbonate in water) at 60° C. for 10 minutes in a brush-type developing unit. Because of the composition, only the unexposed parts of the imagewise exposed individual stratum ($a_2$) of the recording layer (A) were washed away, whereas the imagewise exposed individual stratum ($a_1$), which is not soluble or swellable in aqueous developers, was not attacked. The imagewise exposed and developed recording element was then dried for 2 hours at 65° C., after which it was post-exposed uniformly to actinic light for 10 minutes on the side of the photopolymerized relief layer (A') (previously the individual stratum ($a_2$) of the photopolymerizable recording layer (A)) and for 10 minutes on the side of the dimensionally stable base (B). The recording element was then exposed for 10 minutes to short-wavelength UV light having a wavelength λ of <300 nm, after which the production of the flexographic printing plate was complete.

Surprisingly, it was possible to produce the flexographic printing plate within one day, representing a considerable reduction in the process times compared with known processes.

The individual elements of the photopolymerized relief layer (A') (previously the individual stratum ($a_2$) of the photopolymerizable recording layer (A)) were firmly anchored to the completely polymerized individual stratum ($a_1$) and exhibited excellent adhesion. The relief was in general very well defined and had only straight sidewalls and steep relief walls. Undercutting of relief parts through overwashing was not observed. The relief base was uniformly smooth and non-tacky. The relief depth itself was constant within ±10 μm.

The flexographic printing plate was clamped on a printing cylinder and used in a flexographic printing unit for printing continuous stationery. The conventional flexographic printing inks were used. The flexographic printing plate gave a long run of excellent prints which showed no information loss at all compared with the photographic negatives.

We claim:

1. A continuous process for the production of a photopolymerizable recording layer (A), in which the photopolymerizable recording layer (A) is produced from two or more individual strata ($a_n$) which lie one on top of the other, are firmly bonded to one another and have the same or roughly the same composition or different compositions, by firmly bonding the said strata in the nip of a calender in one operation, the said continuous process comprising the steps of
   (1) separately melting the mixtures ($a_n$) used for the production of the individual strata ($a_n$) and combining the resulting, separate material streams ($a_n$) in the molten state even before they enter the calender nip, without mixing them through turbulence,
   (2) shaping the molten material streams ($a_n$) to give molten sheet-like structures ($a_n$) lying one on top of the other, before they enter the calender nip, before, during or directly after the said streams have been combined, without mixing them through turbulence,
   (3) introducing the molten sheet-like structures ($a_n$) lying one on top of the other into the calender nip, one or both of the two outer molten sheet-like structures ($a_n$) in contact with the calender rollers forming a rotating melt bead or rotating bank, and
   (4) calendering the molten sheet-like structures ($a_n$) lying one on top of the other with production of the photopolymerizable recording layer (A) consisting of individual strata ($a_n$) which lie one on top of the other and are firmly bonded to one another.

2. A process as claimed in claim 1, wherein the time between the combination of the molten material streams ($a_n$) and entry of the molten sheet-like structures ($a_n$) lying one on top of the other into the calender nip is from 10 seconds to 5 minutes.

3. A process as claimed in claim 1, wherein, on entering the calender nip, the molten sheet-like structure ($a_n$) which forms the rotating melt bead or rotating bank has a melt flow index (MFI) which is 1.1 times greater than that of the directly adjacent molten sheet-like structure ($a_n$).

4. A process as claimed in claim 1, wherein the molten material streams ($a_n$) are combined in an adapter and are extruded from a slot die downstream of the adapter, as molten sheet-like structures ($a_n$) lying one on top of the other.

5. A process as claimed in claim 1, wherein the molten material streams ($a_n$) are combined in a multilayer die and extruded as molten sheet-like structures ($a_n$) lying one on top of the other.

6. A process as claimed in claim 4, wherein the molten mixtures ($a_n$) are prepared separately from one another in multiscrew devolatilizing extruders and are transported therein as molten material streams ($a_n$) to the adapter.

7. A process as claimed in claim 5, wherein the molten mixtures ($a_n$) are prepared separately from one another in multiscrew devolatilizing extruders and are transported therein as molten material streams ($a_n$) to the multilayer die.

8. A process as claimed in claim 4, wherein the mixtures ($a_n$) are prepared in single-screw extruders and are transported therein as molten material streams ($a_n$) to the adapter.

9. A process as claimed in claim 5, wherein the molten mixtures ($a_n$) are prepared in single-screw extruders and are transported therein as molten material streams ($a_n$) to the multilayer die.

10. A process as claimed in claim 1, wherein the molten mixtures ($a_n$) are prepared separately from one another in mixers and are transported as molten material streams ($a_n$), by means of single-screw extruders, multi-screw devolatilizing extruders or delivery pumps, to an adapter or to a multilayer die.

11. A process as claimed in claim 1, wherein the molten material streams ($a_n$) are filtered before being combined.

12. A process as claimed in claim 1, wherein one or more molten material streams ($a_n$) are themselves polymerizable and form a photopolymerizable individual stratum ($a_n$) in the course of the process, whereas each further molten material stream ($a_n$) becomes photopolymerizable only during or after contact with one or more of these photopolymerizable molten material streams ($a_n$) and thereafter likewise forms a photopolymerizable individual stratum ($a_n$).

13. A continuous process for the production of a photosensitive recording element having a photopolymerizable recording layer (A) and a temporary base (B), which process comprises preparing the photopolymerizable recording layer (A) by a process as claimed in claim 1, and further wherein the individual strata ($a_n$) lying one on top of the other are bonded in the calender nip, on a free side, to a temporary base (B), which can readily be peeled off again from the surface of the relevant outer individual stratum ($a_n$).

14. A continuous process for the production of a photosensitive recording element having a photopolymerizable recording layer (A) and a dimensionally stable base (B), which process comprises preparing the photopolymerizable recording layer (A) by a process as claimed in claim 1, and further wherein the individual strata ($a_n$) lying one on top of the other are firmly bonded in the calender nip on a free side, to a dimensionally stable base (B).

15. A process as claimed in claim 14, wherein the individual strata ($a_n$) lying one on the top of the other are bonded in the calender nip, on a free side, via an adhesion-promoting layer, to the dimensionally stable base (B).

16. A continuous process for the production of a photosensitive recording element having a photopolymerizable recording layer (A) and a smooth or matte cover sheet (D), which process comprises preparing the photopolymerizable recording layer (A) by a process as claimed in claim 1, and further wherein the individual strata ($a_n$) lying one on top of the other are bonded in the calender nip, on a free side, to a smooth or matte cover sheet (D), which can readily be detached again from the surface of the relevant individual stratum ($a_n$).

17. A process as claimed in claim 16, wherein the individual strata ($a_n$) lying one on top of the other are bonded in the calender nip, on a free side, via a smooth or matt top layer (C), to a cover sheet (D), which can readily be detached again from the surface of the relevant top layer (C).

* * * * *